(12) United States Patent
Shin

(10) Patent No.: US 12,038,549 B2
(45) Date of Patent: Jul. 16, 2024

(54) TOOLS AND METHODS FOR REDUCED MECHANICAL RINGING

(71) Applicant: Halliburton Energy Services, Inc., Houston, TX (US)

(72) Inventor: Chang S. Shin, Albany, CA (US)

(73) Assignee: Halliburton Energy Services, Inc., Houston, TX (US)

(\*) Notice: Subject to any disclaimer, the term of this patent is extended or adjusted under 35 U.S.C. 154(b) by 0 days.

(21) Appl. No.: 15/738,049

(22) PCT Filed: Dec. 30, 2016

(86) PCT No.: PCT/US2016/069407
§ 371 (c)(1),
(2) Date: Dec. 19, 2017

(87) PCT Pub. No.: WO2018/125189
PCT Pub. Date: Jul. 5, 2018

(65) Prior Publication Data
US 2020/0041682 A1    Feb. 6, 2020

(51) Int. Cl.
*G01V 3/18* (2006.01)
*H05K 1/02* (2006.01)

(52) U.S. Cl.
CPC ............ *G01V 3/18* (2013.01); *H05K 1/025* (2013.01); *H05K 2201/10083* (2013.01); *H05K 2201/2045* (2013.01)

(58) Field of Classification Search
None
See application file for complete search history.

(56) References Cited

U.S. PATENT DOCUMENTS 3,376,941 A * 4/1968 Fitch ................ E21B 47/024
340/853.8
3,399,745 A * 9/1968 Sparks ................ G01V 1/48
367/63

(Continued)

FOREIGN PATENT DOCUMENTS

WO    WO-9833365 A1     7/1998
WO    WO-2008141331 A1   11/2008
WO    WO-2017105468 A1 * 6/2017 ............ G01R 33/36

OTHER PUBLICATIONS

Radio Communication Handbook. Eighth Edition. Editors Mike Dennison, Chris Lorek. Radio Society of Great Britain. ISBN 190508608-3. 2005. (Year: 2005).*

(Continued)

*Primary Examiner* — Isam A Alsomiri
*Assistant Examiner* — Jonathan D Armstrong
(74) *Attorney, Agent, or Firm* — John Wustenberg; Parker Justiss, P.C.

(57) ABSTRACT

A printed circuit board assembly includes a printed circuit board, a radio frequency detection circuit, and one or more damping elements. The radio frequency detection circuit is in electrical communication with the printed circuit board and defines a ring-down time interval. The one or more damper elements is mechanically coupled to the printed circuit board and has a damping coefficient that makes the duration of a mechanical ring-down time interval of the printed circuit board assembly shorter than the electrical ring-down time interval of the radio frequency detection circuit.

22 Claims, 5 Drawing Sheets

(56) References Cited

U.S. PATENT DOCUMENTS

| | | | | | |
|---|---|---|---|---|---|
| 3,418,625 | A | * | 12/1968 | Anstey | G01N 29/40 367/40 |
| 3,831,173 | A | * | 8/1974 | Lerner | G01V 3/12 342/22 |
| 4,622,527 | A | * | 11/1986 | Carlson | H03H 1/0007 333/12 |
| 4,646,016 | A | * | 2/1987 | Brown | G01V 3/32 324/303 |
| 4,646,017 | A | * | 2/1987 | Brown | G01V 3/32 324/303 |
| 4,646,018 | A | * | 2/1987 | Brown | G01V 3/32 324/303 |
| 4,646,019 | A | * | 2/1987 | Brown | G01V 3/32 324/303 |
| 4,646,021 | A | * | 2/1987 | Brown | G01V 3/32 324/303 |
| 4,692,908 | A | * | 9/1987 | Ekstrom | G01V 1/46 367/27 |
| 5,093,640 | A | * | 3/1992 | Bischof | H05K 1/0243 333/33 |
| 5,914,862 | A | * | 6/1999 | Ferguson | G06K 19/04 340/572.7 |
| 6,208,023 | B1 | * | 3/2001 | Nakayama | H01L 23/49503 257/666 |
| 6,496,382 | B1 | * | 12/2002 | Ferguson | G06K 19/04 174/254 |
| 9,024,776 | B2 | | 5/2015 | Sugiyama et al. | |
| 2002/0111423 | A1 | * | 8/2002 | Paik | H01L 24/83 524/739 |
| 2003/0107056 | A1 | * | 6/2003 | Chin | H01L 23/5383 257/211 |
| 2003/0151408 | A1 | * | 8/2003 | Kruspe | G01R 33/343 324/303 |
| 2005/0194169 | A1 | * | 9/2005 | Tonomura | H01L 23/50 174/392 |
| 2009/0219019 | A1 | | 9/2009 | Taherian et al. | |
| 2009/0309796 | A1 | * | 12/2009 | Bystrom | H01Q 1/085 343/702 |
| 2013/0264050 | A1 | | 10/2013 | Taherian et al. | |
| 2015/0070864 | A1 | * | 3/2015 | Rainer | H01L 21/563 361/782 |
| 2015/0117862 | A1 | * | 4/2015 | Trotta | H05K 1/0242 398/115 |
| 2015/0260813 | A1 | * | 9/2015 | Mandal | G01V 3/32 324/322 |
| 2016/0238700 | A1 | * | 8/2016 | Matsuura | G01S 15/931 |
| 2018/0027655 | A1 | * | 1/2018 | Brockerhoff | H05K 1/182 361/767 |

OTHER PUBLICATIONS

Peshkovsky, Alexey S., et al. "RF probe recovery time reduction with a novel active ringing suppression circuit." Journal of Magnetic Resonance 177.1 (2005): 67-73. (Year: 2005).*

Wu, Baosong, et al. "Sensor design and implementation for a downhole NMR fluid analysis laboratory." Petroleum Science 9.1 (2012): 38-45. (Year: 2012).*

Hegde, Sriharsha, and K. V. Gangadharan. "Testing of RTV-Silicone based thick magnetorheological elastomers under harmonic loading conditions." 2014. (Year: 2014).*

Buess, M. L., and G. L. Petersen. "Acoustic ringing effects in pulsed nuclear magnetic resonance probes." Review of Scientific Instruments 49.8 (1978): 1151-1155. (Year: 1978).*

Fukushima, Eiichi, and S. B. W. Roeder. "Spurious ringing in pulse NMR." Journal of Magnetic Resonance (1969) 33.1 (1979): 199-203. (Year: 1979).*

Patent Cooperation Treaty (PCT) International Search Report dated Oct. 26, 2017 for International Application No. PCT/US2016/069407.

Patent Cooperation Treaty (PCT) Written Opinion of the International Searching Authority dated Oct. 26, 2017 for International Application No. PCT/US2016/069407.

International Preliminary Report on Patentability for PCT Application No. PCT/US2016/069407, dated Jul. 2, 2019.

* cited by examiner

TOOLS AND METHODS FOR REDUCED MECHANICAL RINGING

CROSS-REFERENCE TO RELATED APPLICATIONS

This application is the national phase under 35 U.S.C. § 371 of PCT International Application No. PCT/US2016/069407, filed Dec. 30, 2016, the contents of which are incorporated herein by reference in its entirety.

BACKGROUND OF THE INVENTION

1. Field of the Invention

The present disclosure generally relates to downhole logging devices, and more particularly to electronic assemblies for downhole logging devices.

2. Description of Related Art

Downhole logging tools, such as magnetic resonance induction logging (MRIL) tools, are commonly used to measure properties of fluid in rock formations. MRIL tools measure the spin-lattice relaxation times and the spin-spin relaxation times, from which various petrophysical properties of the geology surrounding the logging tool can be discerned. Measuring relaxation times generally requires intermittent emission of radio frequency (RF) energy into the rock formation and fluids surrounding the logging tool. For example, a burst of RF energy using a Carr, Purcell, Meiboom, and Gill pulse sequence consisting of one excitation pulse and a train of refocusing pulses separated by a predetermined inter-echo time may be emitted by the logging tool into the surrounding rock formation and fluids. The pulse is provided by application of large RF excitation voltages across antenna terminals; a spin echo signal with much smaller voltage appears during the inter-echo subsequent to a given RF pulse.

It can be desirable to apply as many RF pulses as possible to obtain spin echo signals as frequently as possible prior to the spins relaxing back to thermal equilibrium. The number of RF pulses applied during a given time interval can be limited by ring-down time interval.

Such conventional electromagnetic logging tools and methods of making such electromagnetic logging tools have generally been considered satisfactory for their intended purpose. However, there is still a need in the art for improved electromagnetic logging tools. The present disclosure provides a solution for this need.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

The following detailed description describes example embodiments of the disclosure with reference to the accompanying drawings, which depict various details of examples that show how the disclosure may be practiced. The discussion addresses various examples of novel methods, systems and apparatuses in reference to these drawings, and describes the depicted embodiments in sufficient detail to enable those skilled in the art to practice the disclosed subject matter. Many embodiments other than the illustrative examples discussed herein may be used to practice these techniques. Structural and operational changes in addition to the alternatives specifically discussed herein may be made without departing from the scope of this disclosure.

In this description, references to "one embodiment" or "an embodiment," or to "one example" or "an example" in this description are not intended necessarily to refer to the same embodiment or example; however, neither are such embodiments mutually exclusive, unless so stated or as will be readily apparent to those of ordinary skill in the art having the benefit of this disclosure. Thus, a variety of combinations and/or integrations of the embodiments and examples described herein may be included, as well as further embodiments and examples as defined within the scope of all claims based on this disclosure, as well as all legal equivalents of such claims.

The embodiments described herein relate to improved systems and methods for logging the response of a subterranean formation around a drilling well using RF energy. The disclosed systems and methods advantageously damp the PCB assembly supporting the RF circuit such that vibration of the PCB assembly ceases within the ring-down interval of the RF circuit. This prevents mechanical vibration of the PCB assembly from introducing noise into the RF circuit via parasitic capacitance couplings that typically exist between conductors and circuitry in PCB assemblies.

Figure 1:
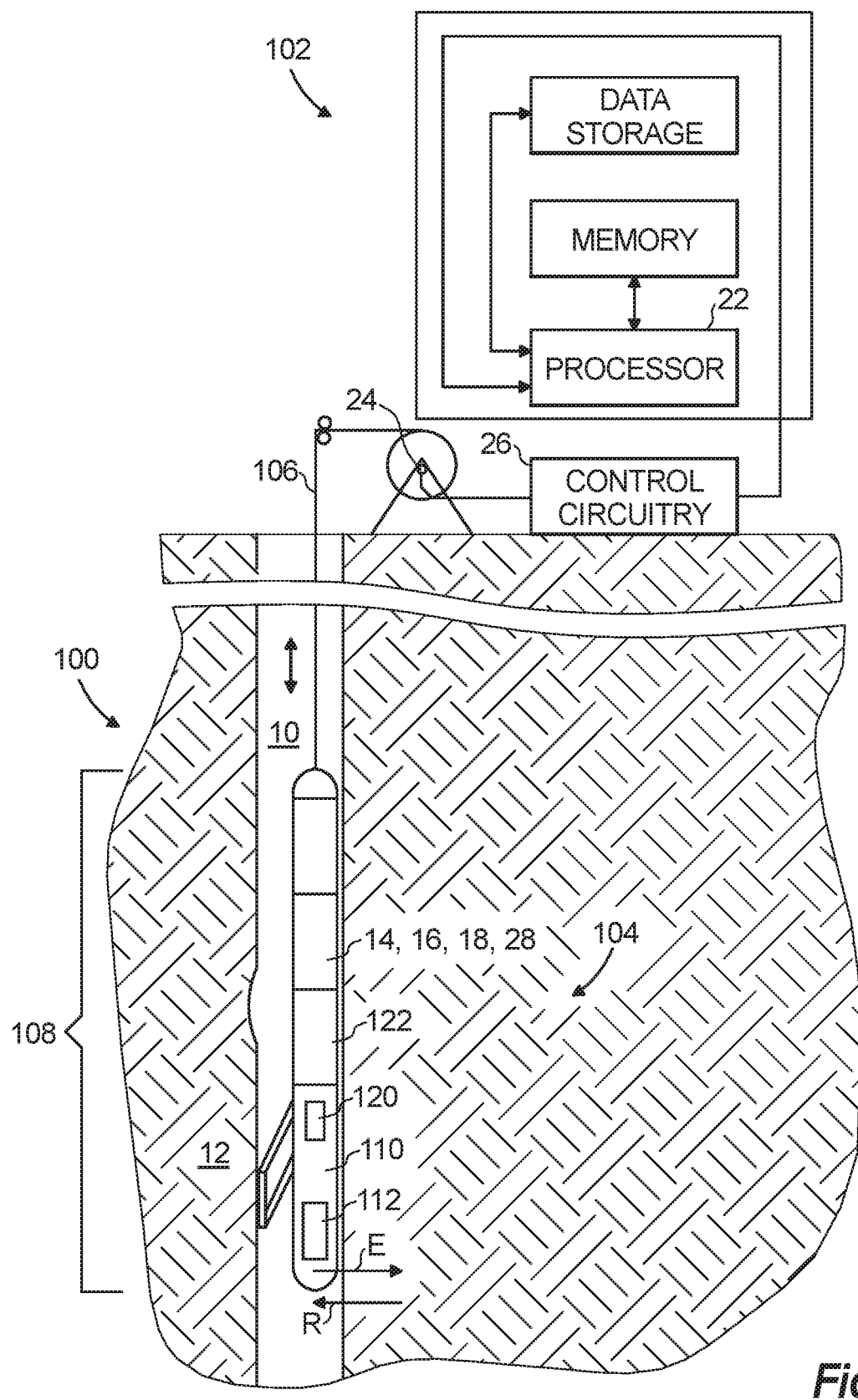
FIG. 1 is a cross-section side elevation view of an exemplary embodiment of an electromagnetic logging tool constructed in accordance with the present disclosure, showing a printed circuit board (PCB) mechanically coupled to a chassis of the logging tool.

Referring the FIG. 1, an exemplary downhole logging system 100 is shown. Downhole logging system includes an uphole arrangement 102, a downhole arrangement 104, and a conveyance 106 coupling uphole arrangement 102 with downhole arrangement 104. Downhole arrangement 104 includes a logging tool chassis 108 disposed within a borehole 10 penetrating an earth formation 12, illustrated in vertical section, and coupled to uphole arrangement 102 through conveyance 106 at the earth's surface, in accordance with various illustrative embodiments of the method and apparatus of the present disclosure. Conveyance 106 can include, by way of non-limiting example, wired drillpipe, coiled tubing (wired and unwired), wireline, slickline, and/or a downhole tractor arrangement. Although illustrated in a terrestrial application, it is to be understood and appreciated that the offshore and subsea applications can also benefit from the present disclosure.

The one or more logging instruments can include, by way of non-limiting example, a resistivity device 14, a porosity-determining device 18, a density determining device 20, and an electromagnetic logging tool 110. Collectively, these devices and others used in the borehole for logging operations are referred to as formation evaluation sensors. In certain embodiments, logging can be done coincident with drilling, such as in a logging-while-drilling (LWD) arrangement or a measurement-while-drilling (MWD) arrangement. In accordance with certain embodiments, logging can be done outside of a drilling environment, such as during an inspection event of an existing well.

The resistivity device 14 may be one of a number of different types of instruments known to the art for measuring the electrical resistivity of formations surrounding a borehole so long as such device has a relatively deep depth of investigation. The porosity determining device 18 may include a neutron device known to the art for using the response characteristics of the formation to neutron radiation to determine formation porosity. Such a device is essentially responsive to the neutron-moderating properties of the formation. The density device 20 may be a gamma-gamma density instrument, used to determine the bulk density of the formation. A downhole processor 22 may be provided at a suitable location and operably connected to the one or more downhole logging instruments.

In certain embodiments, electromagnetic logging tool 110 may include a nuclear magnetic resonance (NMR) device 112. In accordance with certain embodiments, electromagnetic logging tool 110 may include a magnetic resonance induction logging (MRIL) logging tool for to measure properties of fluid in rock formations. Oil-well logging applications using MRIL logging tools generally measure the spin-lattice relaxation times (T1) and the spin-spin relaxation times (T2) to determine various petro physical properties of fluids within a rock formation, e.g., the amount of bound water, the amount of free water, and amounts of hydrocarbons. Measuring relaxation times T1 and T2 typically requires generating radio frequency (RF) excitation pulses. For example, a Carr, Purcell, Meiboom, and Gill (CPMG) RF pulse sequences typically consist of one excitation pulse ($\pi/2$ pulse) and a train of refocusing pulses ($\pi$ pulses), which are separated by a predetermined inter-echo time interval (TE). RF excitation and refocusing pulses are typically generated by applying a relatively large voltage differential across antenna terminal, e.g., on the order of kilo volts; the spin echo signals appear between the it pulses is generally relatively small, e.g., on the order of nanovolts. Although described herein in the context of an MRIL logging tool, it is to be understood and appreciated that the printed circuit board (PCB) assemblies and methods of making such PCB assemblies described herein can benefit other types of MRIL logging tools, NMR logging tools, and imaging devices generally such those used in medical imaging and other applications.

NMR device 112 is arranged to measure the spin-lattice relaxation times and the spin-spin relaxation times and communicate the relaxation times to processor 22 for discerning petro physical properties of the geology surrounding the logging tool. Measuring relaxation times generally requires intermittent emission of radio frequency (RF) energy into the rock formation and fluids surrounding the logging tool. In an exemplary embodiment NMR device 112 generates a Carr, Purcell, Meiboom, and Gill pulse sequence consisting of one excitation pulse and a train of refocusing pulses separated by a predetermined inter-echo time may be emitted by the logging tool into the surrounding rock formation and fluids. The pulse is provided by application of large RF excitation voltages across antenna terminals 114 (shown in FIG. 2); a spin echo signal with much smaller voltage appearing during the inter-echo subsequent to a given RF pulse.

Downhole arrangement 104 is conveyed within borehole 10 by conveyance 106. In the illustrated exemplary embodiment, conveyance 106 includes electrical conductors (not illustrated for reasons of clarity) for communicating electrical signals between the one or more logging instruments carried by chassis 108 and uphole arrangement 102, indicated generally at the earth's surface. Electromagnetic logging tool 110 is cooperatively coupled to processor 22 such that electrical signals may be communicated between electromagnetic logging tool 110 and processor 22. Conveyance 106 attaches to a drum 24 located with uphole arrangement 102 at the earth's surface. Downhole arrangement 104 is thereby arranged to traverse borehole 10 by spooling conveyance 106 from drum 24. It is to be understood and appreciated that other types of conveyances can benefit from the present disclosure, as explained above.

Processor 22 may include such electronic circuitry 26 as is necessary to operate electromagnetic logging tool 110 and to process the data therefrom. Electronic circuitry 26 is communicative with electromagnetic logging tool 110 through a printed circuit board 120 arranged for obtaining radio frequency (RF) signals from the geology surrounding borehole 10. In these respect and RF excitation pulse generator 122 is carried downhole arrangement 104 and is operably connected processor 22 to generate RF excitation pulses E, which excite electrons of petro physical components surrounding borehole 10, which emit RF return signals R. Printed circuit board 120 has an RF detection circuit 122 that detects RF return signals R, which include information indicative of geology surrounding borehole 10. While described herein as a wireline arrangement, those skilled in the art will appreciate that processor 22 can communicate via slickline, a coiled tubing arrangement (where power is supplied downhole and data stored locally in memory), or via an LWD arrangement where telemetry is acquired via acoustic or mud pulse techniques, as suitable for an intended application.

As will be appreciated by those of skill in the art, it is generally desirable to apply as many RF excitation pulses E as possible while logging so that the spin echo signal can be recorded as often as possible before the spins relax back to thermal equilibrium. Although there are a number of factors that can limit the number of RF excitation pulses applied, such as peak RF voltage, strength of the magnetic field gradients, and ring-down time, the number of RF excitation pulses that an electromagnetic logging tool can apply during a given time period is typically constrained by ring-down time interval. As used herein, ring-down time interval means the amount of time required to dissipate electrical and mechanical energy coupled to the RF detection circuit down to the level of the spin echo signal subsequent to the application of the relatively strong RF excitation pulse to the rock formation.

As will also be appreciated by those of skill in the art in view of the present disclosure, the electrical energy in the RF detection circuit 122 can generally be dissipated within a few cycles by using a critical resistance. However, the RF detection circuit is typically weakly coupled to the mechanical arrangement supporting the RF detection circuit, the critical resistance of the RF detection circuit typically cannot efficiently damp the mechanical energy. The inability to efficiently damp the mechanical energy allows the mechanical energy to decay according to its own time constant, a portion of the mechanical energy being converted into electrical energy, which can be measured by the RF detection circuit and mistaken for the spin-echo signal.

Sources of mechanical energy which can be converted into electrical energy within an RF detection circuit include PCB assembly components such as ceramic capacitors, which are commonly employed in RF detection circuits, and conductive traces within the PCB assembly. The present disclosure reduces the mechanical ringing that can persist in certain types of electromagnetic logging tools after strong radio frequency energy. With sufficient suppression of the mechanical ringing, signals, such as the spin echo signal from nuclear magnetic resonance can be recorded more often in a given time, thereby improving the effective signal to noise ratio per unit time. Fast decaying components of the spin echo signal can be detected that otherwise could be masked by noise within the signal.

Figure 2:
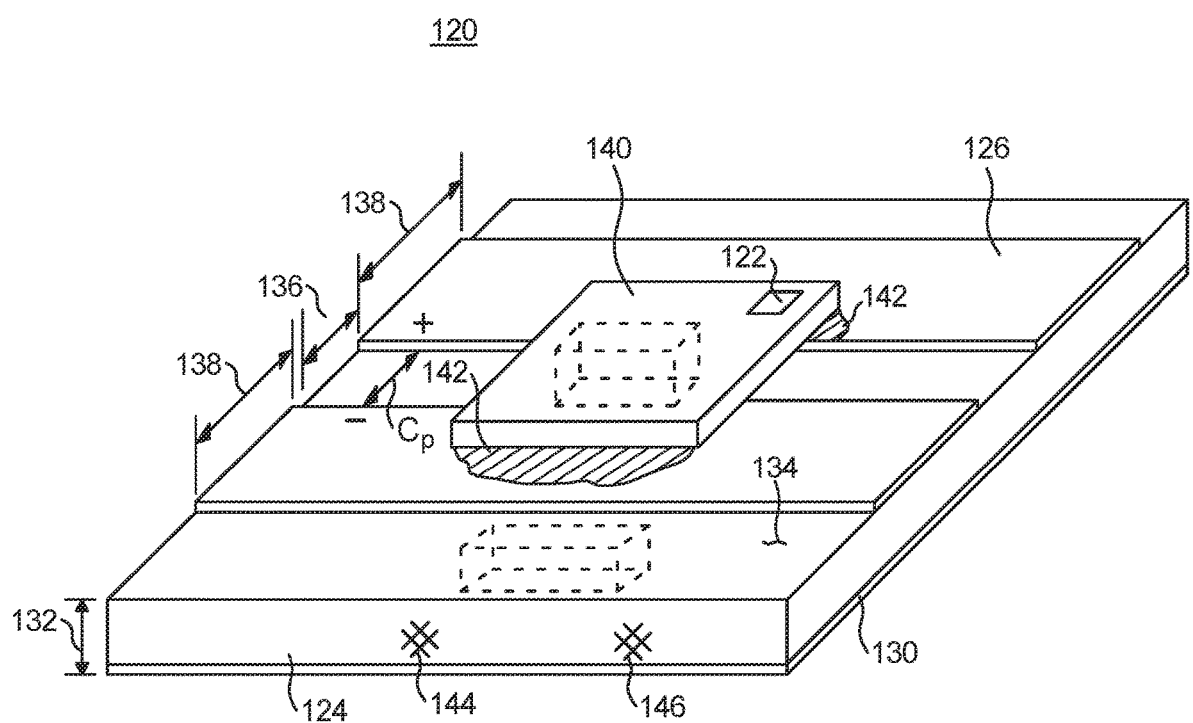
FIG. 2 is a schematic perspective view of the PCB assembly of FIG. 1 according to first embodiment, showing a PCB assembly have one or more damping elements mechanically coupled to the PCB assembly to decrease a mechanical ring-down time interval that is within the electrical ring down interval of the RF detection circuit.

With reference to FIG. 2, an exemplary PCB assembly 120 is shown. PCB assembly 120 generally includes a PCB 124 with a first conductive trace 126, a second conductive trace 128, and a ground plane 130. Ground plane 130 is separated from first conductive trace 126 and second conductive trace 128 by a thickness 132 defined by an electrically insulating body of PCB 124. First conductive trace 126 and second conductive trace 128 are disposed on a common surface 134 of PCB 124 and are separated from one another by a portion of insulating body 132 having a width 136. RF detection circuit 122 includes a ceramic capacitor 140 in electrical communication with PCB 124, ceramic capacitor 140 between mechanically supported by PCB 124 and coupled thereto. In the illustrated exemplary embodiment ceramic capacitor 140 is electrically connected to first conductive trace 126 and second conductive trace 128 through solder connections 142.

Ceramic capacitors, e.g., ceramic capacitor 140, generally vibrate according to the piezoelectric and electrostrictive effects depending upon the material properties of capacitor components. Piezoelectric materials, for example, generally have strong internal electrical fields but do not have inversion symmetry. This causes the strain induced of the capacitor components by an external electrical field to be proportional to the odd powers of the electric field. Therefore, frequencies of the observed ringing signal from the piezo electric material are typically close to the first harmonic of the RF excitation pulse frequency.

Dielectric materials with inversion symmetry can vibrate due to the electrostrictive effect, where strain induced by an external electric field is proportional to the even powers of the electric field. This causes the frequencies of the observed ringing signal to approach the second harmonic of the RF excitation pulse frequency. Since ceramic capacitors generally have high acoustic quality factors, e.g., about 300 or larger, ringing can persist for a few hundred microseconds at an RF excitation frequency of about 500 kilohertz. This ringing can propagate into the printed circuit board (PCB) supporting the ceramic capacitor, such as through the leads electrically connecting the ceramic capacitor to the PCB, the ceramic capacitor thereby inducing ringing into the PCB owing to the microphonic effect.

Since ceramic capacitors are typically mounted on a printed circuit board (PCB), the RF excitation pulses induce mechanical vibration into the PCB through the electric field associated with the RF excitation pulses. The mechanical vibration changes the parasitic capacitance and parasitic inductance of the PCB. For example, for a PCB having parasitic capacitance $C_P$ and parasitic inductance $L_P$, $$i = dQ/dt = v \cdot dCP/dt + Cp \cdot dv/dt$$

and $$v = d\phi/dt = i \cdot dtp/dt + Lp \cdot di/dt$$

Therefore, while the vibration may be relatively small, e.g., sub-nanometer, the associated change in parasitic capacitance $C_P$ and/or parasitic inductance $L_P$ resulting from the mechanical vibration of the PCB induces an electrical signal at the frequency of mechanical vibration of the PCB. Since the electrical signal can mask the inter-echo signal of interest, electrical signals appearing in the RF detection signal within the mechanical ring-down time interval may have components associated with the vibration that mask components indicate of the inter-echo response from fluids within the rock formation.

PCB assembly 120 has one or more damping element for mitigating mechanical vibration generated by ceramic capacitor 140 and transmitted by PCB 124. For example, in certain embodiments, the one or more damping element can include a rigid substrate 144 of PCB 124. Rigid substrate 144 can be tuned to dampen vibration within a predetermined frequency range including the above-described harmonics of the excitation frequencies. The tuning of rigid substrate 144 can reduce (or eliminate) mechanical vibration of PCB assembly 120, thereby reducing (or eliminating) electrical energy applied to RF detection circuit 122 from mechanical vibration of PCB assembly 120.

As will be appreciated by those of skill in the art in in view of the present disclosure, the one or more damping element allows for acquiring data with reduced noise that could otherwise be present in some logging tools. For example, an exemplary method of using a logging tool includes emitting RF energy and receiving at least a portion of the RF energy at an RF detection circuit coupled to a PCB assembly. Mechanical vibration of the PCB assembly is damped by the one or more damping element such the mechanical ring-down time interval of the PCB assembly associated with the received RF energy is less than the electrical ring-down time interval associated with the received RF energy.

In accordance with certain embodiments, the one or more damping element can include a flexible substrate 146 of PCB 124. Flexible substrate 146 can have reduced responsiveness, e.g., with low acoustic quality. Flexible substrate 146 can reduce (or eliminate) mechanical vibration of PCB assembly 120, thereby reducing (or eliminating) electrical energy applied to RF detection circuit 122 from mechanical vibration of PCB assembly 120.

It is also contemplated that the one or more damping elements can include an acoustic damping material 148 mechanically coupled to PCB 124, e.g., to rigid substrate 144 or to flexible substrate 146. Alternatively or additionally, an acoustic damping material 150 can be mechanically coupled to ceramic capacitor 140. Acoustic damping material 148 and/or acoustic damping material 150 can reduce the responsiveness of PCB assembly 120 to vibration of ceramic capacitor 140, thereby reducing (or eliminating)

electrical energy applied to RF detection circuit 122 from mechanical vibration of PCB assembly 120.

Figure 3:
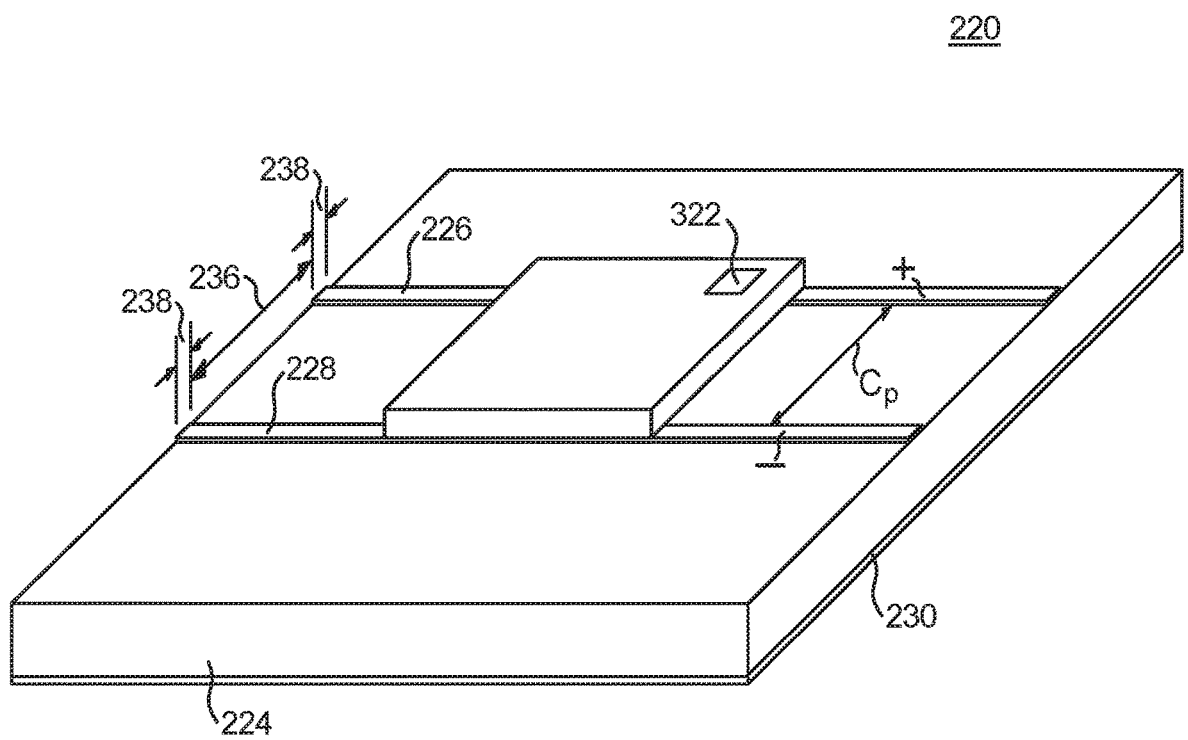
FIG. 3 is a schematic perspective view of the PCB assembly of FIG. 1 according another embodiments, showing a first conductive trace disposed on a surface of the PCB assembly substrate having reduced width and increased spacing from a second conductive to reduce the mechanical ring-down time interval of the PCB assembly.

With reference to FIG. 3, a second exemplary PCB assembly 220 is shown. PCB assembly 220 is similar to PCB assembly 120 (shown in FIG. 2), one or more damping elements formed by spacing and dimensioning of conductive traces arranged on PCB 124.

For example, the one or more damping elements can include relatively thin conductors electromagnetically coupled to one another and having relatively small parasitic capacitance in comparison to conductive traces of PCB assembly 120. In this respect PCB 220 includes a first conductive trace 226 having a width 228 and a second conductive trace 228. Widths 228, illustrated as equivalent for purposes of explanation and not for limitation, are smaller than widths 138 (shown in FIG. 2) of first conductive trace 126 (shown in FIG. 2) and second conductive trace 128 (shown in FIG. 2).

Reducing the width of the conductive traces carried by PCB 224 relative to widths 138 (shown in FIG. 2) PCB 124 (shown in FIG. 2) reduces the parasitic capacitance of first conductive trace 226 and second conductive trace 228, and commensurately increasing impendence of first conductive trace 226 and second conductive trace 228. Reduction of parasitic capacitance in turn reduces the amount of mechanical energy transferred from PCB assembly 224 into RF detection circuit 222, reducing duration of the ring-down time interval of RF detection circuit 222. In contemplated embodiments, widths 238 are smaller than the design rule generally applied in positioning conductive traces on PCB substrates for a given manufacturing process, widths 238 being smaller than ⅛ inch in an exemplary embodiment. In contrast, widths 132 (shown in FIG. 2) may be about ⅛ of an inch in size.

It is also contemplated that the one or more damping elements can alternatively (or additionally) be defined by increased spacing between first conductive trace 226 and second conductive trace 228. In this respect width 236, which is greater than width 136 (shown in FIG. 2), reduces magnitude of parasitic capacitance generated between the two traces for a given voltage. As above, reduction of parasitic capacitance in turn reduces the amount of mechanical energy transferred from PCB assembly 224 into RF detection circuit 222, reducing duration of the ring-down time interval of RF detection circuit 222. As will appreciated, increased conductor spacing can be used in conjunction with reduced conductive trace width or independently to reduce the ring-down time interval of RF detection circuit 222.

Figure 4:
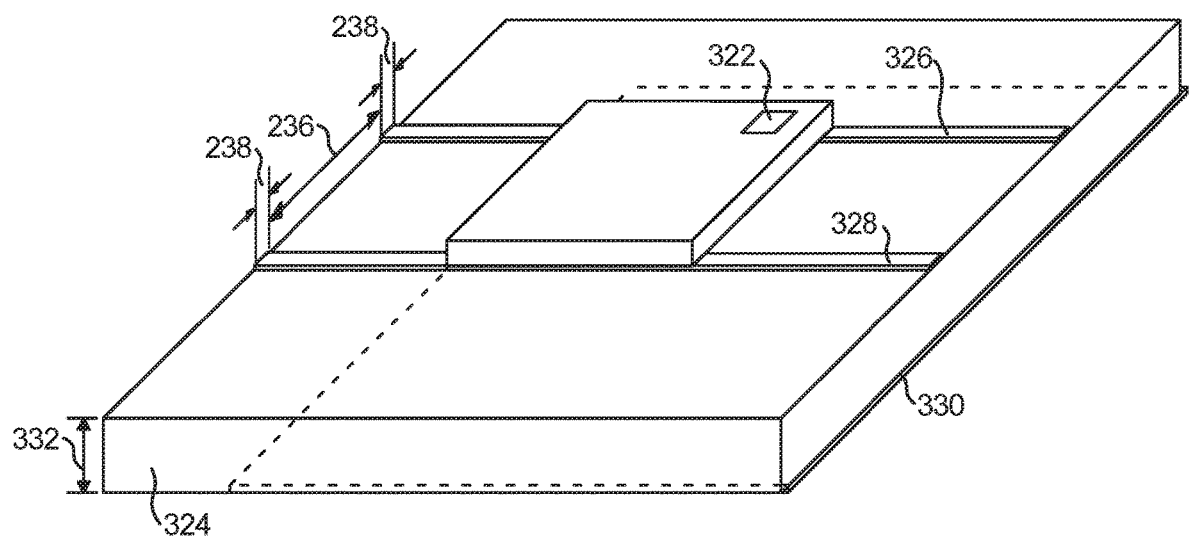
FIG. 4 is a schematic view of the PCB assembly of FIG. 1, showing first and second conductive traces disposed on opposite sides of the PCB assembly substrate to reduce the mechanical ring-down time interval of the PCB assembly.

With reference to FIG. 4, a third exemplary PCB assembly 320 is shown. PCB assembly 320 is similar to PCB assembly 120 (shown in FIG. 2), and additionally includes a PCB 324 with increased thickness 332. Increased thickness 332 increases separation distance defined between first conductive trace 326 and ground plane 330. Increased thickness 332 also increases separation distance defined between second conductive trace 328 and ground place 330. As ground plane 330 is nominally or neutral (or zero) potential, the increased separation increases distance between the respective potentials of first conductive trace 326 and second conductive trace 328 and ground plane 330, reducing parasitic capacitance defined the respective conductive trace and ground plane 330 in relation to smaller thicknesses, e.g., thickness 132 (shown in FIG. 2), for a given conductive trace and voltage.

As will be appreciated by those of skill in the art in view of the present disclosure, the reduced parasitic capacitance between first conducive trace 326 and ground plane 330, and the reduced parasitic capacitance between second ground plane 328 and ground plane 330, collectively reduce the amount of mechanical energy transferred from PCB assembly 224 into RF detection circuit 322, reducing duration of the ring-down time interval of RF detection circuit 222. As will appreciated, increased thickness 332 of PCB 324 can be used in conjunction with reduced conductive trace width 238 (shown in FIG. 2) and/or with increased conductive trace spacing 236 (shown in FIG. 2), or independently, to reduce the ring-down time interval of RF detection circuit 322.

Figure 5:
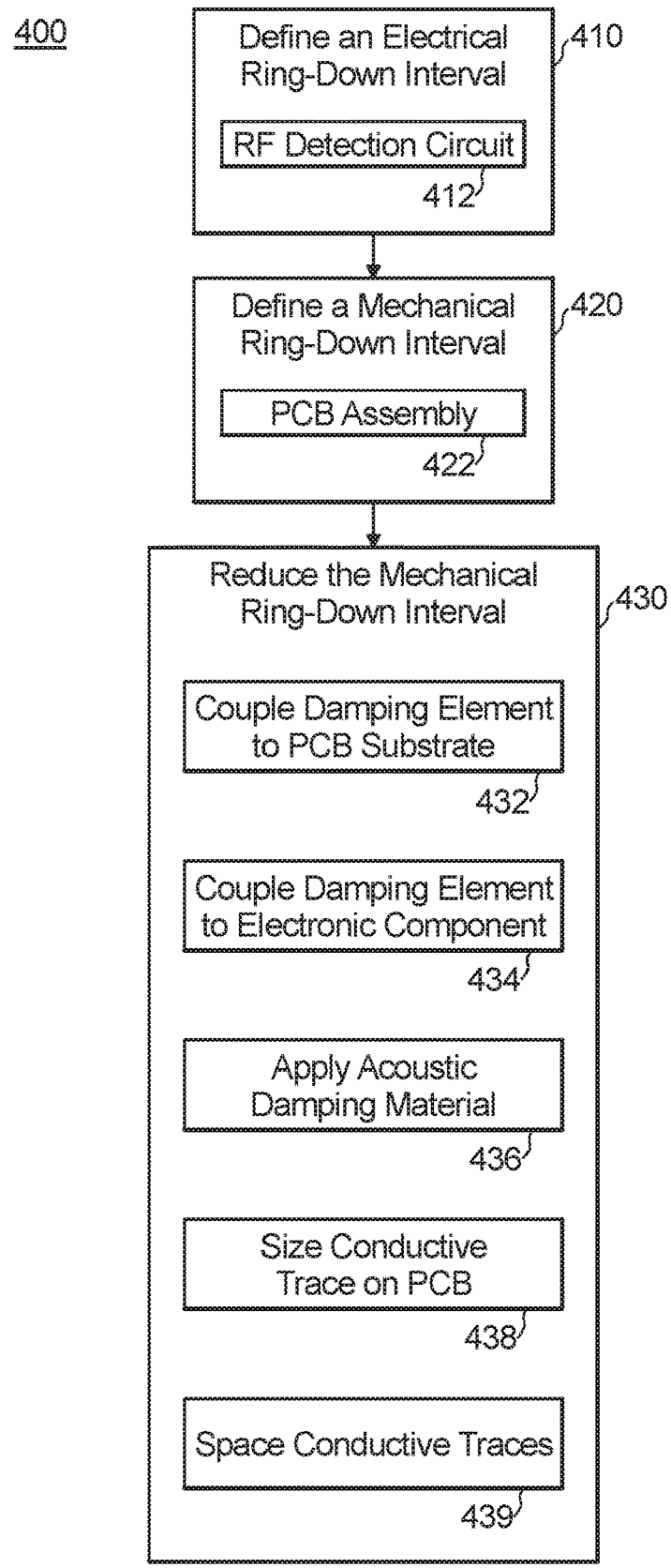
FIG. 5 is block diagram of a method of making a PCB assembly for an electromagnetic logging tool with reduced mechanical ring-down time interval, showing steps of the method.

With reference to FIG. 5, a method of making a PCB assembly 400 is shown. Method 400 generally includes defining an electrical ring-down time interval, as shown with box 410, and defining a mechanical ring-down time interval, as shown with box 420. The electrical ring-down time interval is defined by an RF detection circuit, e.g., RF detection circuit 122 (shown in FIG. 2), as shown with box 412. The mechanical ring-down time interval is defined by a PCB assembly, e.g., PCB assembly 122 (shown in FIG. 2), that is electrical communication with the RF detection circuit, as shown with box 422. It is contemplated the PCB assembly be mechanically coupled to the RF detection circuit such a portion of the mechanical energy, e.g., vibration, of the PCB assembly is converted into electrical energy within the RF detection circuit.

Method 400 also includes reducing the mechanical ring-down time interval of the PCB assembly, as shown with box 430. Reducing the mechanical ring-down time interval of the PCB assembly can include coupling one or more damping element to the PCB assembly. For example, the damping element can be an acoustic damping material, e.g., acoustic damping material 148 (shown in FIG. 2) and/or acoustic damping material 150 (shown in FIG. 2), as shown with box 432 and box 434. The damping element incorporated into a PCB, e.g., PCB 124 (shown in FIG. 2), as shown with box 438 and 439. In this respect conductive traces of the PCB, e.g., first conductive trace 226 (shown in FIG. 3) and second conductive trace 228 (shown in FIG. 3), can be reduced in size in comparison with traces sized according to a design rule. Spacing between the first and second traces can also be increased, such as between the conductive traces or between a ground plane, e.g., ground plane 330 (shown in FIG. 5), and each conductive trace.

In certain embodiments, the electrical ring-down time interval can be defined by a radio frequency detection circuit in electrical communication with a PCB of the PCB assembly. The method can include defining the electrical ring-down time interval with a radio frequency detection circuit in electrical communication with the PCB. The method can include coupling one or more damping elements to the PCB assembly. The damping element can reduce a mechanical ring-down time interval of the PCB assembly.

It is also contemplated that, in accordance with certain embodiments, the method can include coupling one or more damping elements to the PCB assembly. A rigid substrate of the PCB can be arranged to have low acoustic quality within a predetermined frequency range. A rigid substrate of the PCB can be arranged to have low acoustic quality within a predetermined range. An acoustic damping material can be applied to a substrate of the PCB. An acoustic damping material can be applied to an electronic component of the PCB assembly. It is contemplated that a conductive trace disposed on the PCB substrate can be sized to reduce parasitic capacitance of the conductive trace.

In embodiments described herein, electromagnetic logging devices are provided with substantially reduced ringing levels. The reduced ringing enables signals provided by such electromagnetic logging devices, such as the spin echo signal from an nuclear-magnetic resonance pulse sequence like a Carr, Purcell, Meiboom, and Gill (CPMG) pulse sequence, to be recorded more frequently for a given ring-down time interval. In accordance with certain embodiments, the reduced ringing level can improve the effective signal to noise ratio per unit time in the signal provided by such electromagnetic logging devices. It is also contemplated that, in accordance with certain embodiments, the reduced ringing level can allow the signal provided by such electromagnetic logging devices to have a relatively short TE, enabling detection within the signal of spins with very short relaxation times, such as proton signals indicative of the presence of heavy oil for example.

A printed circuit board (PCB) assembly includes a PCB, a radio frequency (RF) detection circuit, and one or more damping elements. The RF detection circuit is in electrical communication with the PCB and defines an electrical ring-down time interval. The one or more damper elements is mechanically coupled to the PCB and has a damping coefficient that defines a mechanical ring-down time interval of the PCB assembly of duration shorter than duration of the RF detection circuit electrical ring-down time interval.

In certain embodiments, the PCB can include a substrate. The substrate can include a rigid substrate. The rigid substrate can be tuned to have low acoustic quality within a predetermined frequency range. The substrate can include a flexible substrate. The flexible substrate can have low acoustic quality within a predetermined frequency range. One or more damping elements can be mechanically coupled to the substrate. The one or more damping elements can include an acoustic damping material applied to the PCB.

In accordance with certain embodiments, an electronic device can be mechanically coupled to the substrate and in electrical communication with the PCB. The electronic device can be a component of the RF detection circuit. The electronic device can be a capacitor. The capacitor can include a ceramic material. One or more damper elements can be mechanically coupled to the electronic device. The one or more damper elements can include an acoustic damping material applied to a component of the RF detection circuit.

It is contemplated that, in accordance with certain embodiments, the one or more damping elements can include a conductive trace disposed on a surface of the PCB. The conductive trace can have reduced with to lower parasitic capacitance of the conductive trace. The conductive trace can have a width that is less than about ⅛ inch. The conductive trace can have increased impedance. The reduced width of the conductive trace can define the mechanical ring-down time interval of the PCB assembly.

It is also contemplated that, in accordance with certain embodiments, the conductive trace can be a first conductive trace and the PCB can include a second conductive trace. The second conductive trace can be electromagnetically coupled to the first conductive trace. The first and second conductive traces can be disposed on a common surface of the PCB. Spacing between the first conductive trace and the second conductive trace on the common surface can be increased to reduce parasitic capacitance between the first and second conductive traces. The first and second conductive traces can be disposed on opposed surfaces of the PCB. Thickness of the PCB can be increased to increase separation distance between the first and second traces to reduced parasitic capacitance between the first and second conductive traces. The increased spacing between the first and second conductive traces can define the mechanical ring-down time interval of the PCB assembly. Either or both of conductive trace width, spacing between the conductive trace and another conductive trace disposed on common PCB surface, and spacing between the conductive trace and another conductive trace disposed on an opposite PCB surface can define the mechanical ring-down time interval of the PCB assembly.

An electromagnetic logging tool includes a chassis, a radio frequency generator, and a printed circuit board assembly. The radio frequency generator is coupled and the printed circuit board is coupled to the chassis. The printed circuit board assembly includes a printed circuit board, a radio frequency detection circuit in electrical communication with the printed circuit board and defined an electrical ring-down time interval, and one or more damper elements. The one or more damper elements is mechanically coupled to the printed circuit board and has a damping coefficient that defines a mechanical ring-down time interval of the printed circuit board assembly that is within the electrical ring-down time interval of the radio frequency detection circuit.

A method of making a printed circuit board (PCB) assembly includes defining an electrical ring-down time interval. The method also includes defining a mechanical ring-down time interval. The mechanical ring-down time interval is within the electrical ring-down time interval.

In certain embodiments, the electrical ring-down time interval can be defined by a radio frequency detection circuit in electrical communication with a PCB of the PCB assembly. The method can include defining the electrical ring-down time interval with a radio frequency detection circuit in electrical communication with the PCB. The method can include coupling one or more damping elements to the PCB assembly. The damping element can reduce a mechanical ring-down time interval of the PCB assembly.

It is also contemplated that, in accordance with certain embodiments, the method can include coupling one or more damping elements to the PCB assembly. A rigid substrate of the PCB can be arranged to have low acoustic quality within a predetermined frequency range. A rigid substrate of the PCB can be arranged to have low acoustic quality within a predetermined range. An acoustic damping material can be applied to a substrate of the PCB. An acoustic damping material can be applied to an electronic component of the PCB assembly. It is contemplated that a conductive trace disposed on the PCB substrate can be sized to reduce parasitic capacitance of the conductive trace.

The methods and systems of the present disclosure, as described above and shown in the drawings, provide for electromagnetic logging devices with superior properties including improved detection sensitivity. While the apparatus and methods of the subject disclosure have been shown and described with reference to preferred embodiments, those skilled in the art will readily appreciate that changes and/or modifications may be made thereto without departing from the scope of the subject disclosure.

What is claimed is:
1. A printed circuit board assembly of a nuclear magnetic resonance (NMR) device, comprising:
   a printed circuit board (PCB);
   a radio frequency (RF) detection circuit for use with NMR techniques in electrical communication with the PCB and defining an electrical ring-down time interval of the RF detection circuit; and
   at least one damper element mechanically coupled to the PCB, wherein:

the damper element is selected from the group consisting of a rigid substrate tuned to dampen vibration within a predetermined frequency range and a flexible substrate having low acoustic quality within a predetermined frequency range;

the damper element has a damping coefficient configured to place a mechanical ring-down time interval of the PCB assembly to be no longer than the defined electrical ring-down time interval of the RF detection circuit; and the electrical ring-down time interval of the RF detection circuit is defined independently of the mechanical ring-down time interval of the PCB assembly.

2. The PCB assembly as recited in claim 1, wherein the at least one damper element includes an acoustic damping material applied to the component of the RF detection circuit.

3. The PCB assembly as recited in claim 1, wherein the at least one damper element includes an acoustic damping material applied to the PCB.

4. The PCB assembly as recited in claim 1, further comprising a conductive trace disposed on a surface of the PCB, the conductive trace being electrically coupled to the component, wherein the at least one damper element includes the conductive trace.

5. The PCB assembly as recited in claim 4, wherein the conductive trace has reduced width to lower parasitic capacitance of the conductive trace and is configured in order that the damping coefficient is configured to place the mechanical ring-down time interval of the PCB assembly within the electrical ring-down time interval of the RF detection circuit.

6. The PCB assembly as recited in claim 4, wherein the conductive trace has a width that is less than about 1/8 inch and is configured in order that the damping coefficient is configured to place the mechanical ring-down time interval of the PCB assembly within the electrical ring-down time interval of the RF detection circuit.

7. The PCB assembly as recited in claim 4, wherein the conductive trace is a high impedance conductive trace and is configured in order that the damping coefficient is configured to place the mechanical ring-down time interval of the PCB assembly within the electrical ring-down time interval of the RF detection circuit.

8. The PCB assembly as recited in claim 4, wherein the conductive trace is a first conductive trace, and further including a second conductive trace separated from the first conductive trace by an electrically insulating portion of the PCB, wherein a width of the separation between the first and second conductive traces is configured in order that the damping coefficient is configured to place the mechanical ring-down time interval of the PCB assembly within the electrical ring-down time interval of the RF detection circuit.

9. The PCB assembly as recited in claim 7, wherein the first and second conductive traces are disposed on a common surface of the PCB, wherein the first and second conductive traces and the PCB are arranged with an electrically insulating portion of the PCB having a width that is greater than widths of the first and second conductive traces and is configured in order that the damping coefficient is configured to place the mechanical ring-down time interval of the PCB assembly within the electrical ring-down time interval of the RF detection circuit.

10. The PCB assembly as recited in claim 7, wherein the first and second conductive traces are disposed on opposite surfaces of the PCB, wherein the electrically insulating portion of the PCB is a PCB thickness which is greater that widths of the first and second conductive traces and is configured in order that the damping coefficient is configured to place the mechanical ring-down time interval of the PCB assembly within the electrical ring-down time interval of the RF detection circuit.

11. The PCB assembly as recited in claim 4, wherein a width of the conducive trace, spacing of the conductive trace, and thickness of the substrate cooperate are configured to define the mechanical ring-down time interval of the PCB assembly in order that the damping coefficient is configured to place the mechanical ring-down time interval of the PCB assembly within the electrical ring-down time interval of the RF detection circuit.

12. A logging tool, comprising:
a chassis;
a radio frequency (RF) generator of a nuclear magnetic resonance (NMR) device coupled to the chassis;
a printed circuit board (PCB) assembly coupled to the chassis, the PCB assembly comprising:
a PCB;
an RF detection circuit for use with NMR techniques in electrical communication with the PCB and defining an electrical ring-down time interval of the RF detection circuit; and
at least one damper element mechanically coupled to the PCB, wherein:
the damper element is selected from the group consisting of a rigid substrate tuned to dampen vibration within a predetermined frequency range and a flexible substrate having low acoustic quality within a predetermined frequency range;
the damper element has a damping coefficient configured to place a mechanical ring-down time interval of the PCB assembly to be no longer than the defined electrical ring-down time interval of the RF detection circuit; and
the electrical ring-down time interval of the RF detection circuit is defined independently of the mechanical ring-down time interval of the PCB assembly.

13. The logging tool as recited in claim 12, wherein the at least one damper element includes an acoustic damping material applied to a component of the RF detection circuit.

14. The logging tool as recited in claim 12, wherein the at least one damper element includes an acoustic damping material applied to the PCB.

15. The logging tool as recited in claim 12, wherein the at least one damper element includes a conductive trace defined on a surface of the PCB.

16. The logging tool as recited in claim 15, wherein a width of the conducive trace, spacing of the conductive trace, and thickness of the substrate cooperate to define the mechanical ring-down time interval of the PCB assembly, the conductive trace being electrically coupled to the component.

17. A method of making a PCB assembly for a nuclear magnetic resonance (NMR) system, comprising:
defining an electrical ring-down time interval of the RF detection circuit; and
configuring at least one damper element for use with NMR techniques, including configuring the at least one damper element to define a mechanical ring-down time interval of the PCB assembly to be shorter than the defined electrical ring-down time interval, wherein:
the damper element is selected from the group consisting of a rigid substrate tuned to dampen vibration within a predetermined frequency range and a flexible substrate having low acoustic quality within a predetermined frequency range; and the electrical ring-down time interval of the RF detection circuit is defined independently of the mechanical ring-down time interval of the PCB assembly.

18. The method as recited in claim 17, wherein electrical ring-down time interval is defined by a radio frequency detection circuit in electrical communication with a PCB of the PCB assembly.

19. The method as recited in claim 17, further comprising coupling the at least one damping element to the PCB assembly, wherein the at least one damping element is configured to reduce the mechanical damping ring-down time interval of the PCB assembly to be no longer than the electrical ring-down time interval.

20. The method as recited in claim 19, wherein coupling the at least one damping element to the PCB assembly includes one or more of (a) applying an acoustic damping material to a substrate of a PCB, (b) applying an acoustic damping material to an electronic component coupled to the substrate, (c) sizing a conductive trace disposed on the substrate, and (d) spacing a conductive trace in relation to another conductive trace disposed on the substrate.

21. A method of using a logging tool using a nuclear magnetic resonance (NMR) device, comprising:

emitting radio frequency (RF) energy for use with NMR techniques;

receiving at least a portion of the RF energy at an RF detection circuit coupled to a printed circuit board (PCB) assembly, the RF detection circuit defining an electrical ring-down time interval of the RF detection circuit associated with the received RF energy, the PCB assembly having a mechanical ring-down time interval associated with received RF energy, wherein:

the damper element is selected from the group consisting of a rigid substrate tuned to dampen vibration within a predetermined frequency range and a flexible substrate having low acoustic quality within a predetermined frequency range;

the electrical ring-down time interval of the RF detection circuit is defined independently of the mechanical ring-down time interval of the PCB assembly; and damping vibration of the PCB assembly such that the mechanical ring-down time interval of the PCB assembly associated with the received RF energy is shorter than the defined electrical ring-down time interval associated with the received RF energy.

22. The PCB assembly as recited in claim 1, wherein the component of the RF detection circuit is a capacitor.

* * * * *